United States Patent
Hendriksen et al.

(10) Patent No.: US 10,825,648 B2
(45) Date of Patent: Nov. 3, 2020

(54) STUDYING DYNAMIC SPECIMENS IN A TRANSMISSION CHARGED PARTICLE MICROSCOPE

(71) Applicant: FEI Comapny, Hillsboro, OR (US)

(72) Inventors: Bastiaan Lambertus Martinus Hendriksen, Eindhoven (NL); Erik René Kieft, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/364,019

(22) Filed: Mar. 25, 2019

(65) Prior Publication Data

US 2019/0311882 A1    Oct. 10, 2019

(30) Foreign Application Priority Data

Apr. 5, 2018 (EP) .................................. 18165886

(51) Int. Cl.
*H01J 37/28* (2006.01)
*H01J 37/244* (2006.01)
*H01J 37/26* (2006.01)
*H01J 37/04* (2006.01)

(52) U.S. Cl.
CPC .......... *H01J 37/261* (2013.01); *H01J 37/045* (2013.01); *H01J 37/244* (2013.01); *H01J 37/28* (2013.01); *H01J 2237/043* (2013.01); *H01J 2237/0435* (2013.01); *H01J 2237/221* (2013.01); *H01J 2237/226* (2013.01); *H01J 2237/24455* (2013.01); *H01J 2237/24495* (2013.01); *H01J 2237/2802* (2013.01)

(58) Field of Classification Search
CPC ............... H01J 37/28; H01J 2237/2802; H01J 2237/221; H01J 2237/226; H01J 2237/24475; H01J 2237/24495; H01J 2237/0435; H01J 2237/0492; H01J 2237/151; H01J 2237/2446; G01N 21/00; G01N 23/04; G01N 23/20058; G01N 23/20083; G01N 23/2055; G01N 23/2206; G01N 23/225

USPC ............. 250/311, 306, 307, 310, 334, 358.1, 250/359.1, 370.08, 559.06

See application file for complete search history.

(56) References Cited

U.S. PATENT DOCUMENTS

| | | | | |
|---|---|---|---|---|
| 6,570,156 | B1* | 5/2003 | Tsuneta | H01J 37/26 250/311 |
| 8,933,401 | B1* | 1/2015 | Reed | H01J 37/28 250/307 |
| 9,165,743 | B2* | 10/2015 | Reed | H01J 37/265 |
| 9,464,998 | B2* | 10/2016 | Zewail | H01J 37/26 |

(Continued)

FOREIGN PATENT DOCUMENTS

EP    3133633 A1    2/2017

*Primary Examiner* — David A Vanore (57) ABSTRACT

Methods and systems for examining a dynamic specimen using a Transmission Charged Particle Microscope are disclosed. An example method includes sparsifying a beam of charged particles to produce at detector an image of a sample comprising a distribution of sub-images that are mutually isolated from one another at least along an elected scan path, and using a scanning assembly to cause relative motion of said image and said detector along said scan path during a time interval Δt so as to smear out each sub-image into a detection streak on said detector, each such streak capturing temporal evolution of its associated sub-image during said time interval Δt.

20 Claims, 5 Drawing Sheets

(56) References Cited

U.S. PATENT DOCUMENTS

| | | | |
|---|---|---|---|
| 9,984,852 B1* | 5/2018 | Luiten | H01J 37/26 |
| 10,014,158 B1* | 7/2018 | Janssen | G06T 5/50 |
| 10,224,174 B1* | 3/2019 | Freitag | H01J 37/147 |
| 10,446,366 B1* | 10/2019 | Lazic | H01J 37/153 |
| 2009/0194691 A1* | 8/2009 | Kaji | H01J 37/244 |
| | | | 250/311 |
| 2014/0138542 A1* | 5/2014 | Inada | H01J 37/21 |
| | | | 250/310 |
| 2017/0146787 A1* | 5/2017 | Reed | H01J 37/222 |
| 2017/0243713 A1* | 8/2017 | Kieft | H01J 37/045 |
| 2018/0019098 A1* | 1/2018 | Bosch | H01J 37/20 |
| 2018/0151326 A1* | 5/2018 | Kieft | H01J 37/045 |
| 2018/0323036 A1* | 11/2018 | Mohammadi-Gheidari | |
| | | | G02B 21/06 |
| 2019/0057836 A1* | 2/2019 | Buijsse | H01J 37/26 |
| 2019/0311880 A1* | 10/2019 | Tiemeijer | H01J 37/285 |
| 2019/0311882 A1* | 10/2019 | Hendriksen | H01J 37/244 |
| 2019/0341243 A1* | 11/2019 | Freitag | H01J 37/224 |
| 2019/0348254 A1* | 11/2019 | Lazic | H01J 37/222 |
| 2019/0378680 A1* | 12/2019 | Tiemeijer | H01J 37/26 |
| 2019/0393013 A1* | 12/2019 | Sed'a | H01J 37/20 |
| 2020/0057011 A1* | 2/2020 | Tuma | G01J 3/44 |

* cited by examiner

STUDYING DYNAMIC SPECIMENS IN A TRANSMISSION CHARGED PARTICLE MICROSCOPE

The invention relates to a method of examining a dynamic specimen using a Transmission Charged Particle Microscope (TCPM) comprising:
- A source, for producing a beam of charged particles;
- A specimen holder, for holding the specimen in a specimen plane;
- An illumination system, for directing said beam onto the specimen;
- An imaging system, for directing charged particles that are transmitted through the specimen onto a detector in a detector plane.

The term "dynamic" as here employed is intended to refer to a specimen that undergoes observable change (e.g. evolution and/or motion) during the course of its examination in the microscope. Often, such change will occur on very short timescales, e.g. of the order of μs, ns or ps.

The invention also relates to a charged particle microscope in which such a method can be enacted.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.
- A SEM can also be used in "transmission mode", e.g. when using relatively thin samples and a relatively high incident beam energy. Such a tool is often called a "TSEM" (Transmission SEM), and it will typically have a relatively rudimentary imaging system (e.g. a single lens and deflector) disposed between the specimen and post-specimen detector.

As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a Charged Particle Microscope (CPM) will comprise at least the following components:
- A particle source, such as a W or $LaB_6$ source, Schottky gun or Cold Field Emission Gun (CFEG) in the case of electrons, or a Liquid Metal Ion Source (LMIS) or Nano-Aperture Ion Source (NAIS) in the case of ions, for instance.
- An illumination system/illuminator, which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.
- A specimen holder—generally connected to a positioning system—on which a specimen under investigation can be held and positioned (e.g. displaced, tilted, rotated). If desired, this holder can be moved so as to effect scanning motion of the specimen w.r.t. the beam. When designed to hold cryogenic specimens, the specimen holder can comprise means for maintaining said specimen at cryogenic temperatures, e.g. using an appropriately connected cryogen vat.
- A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM or TSEM, for example), a CPM will additionally comprise:
- An imaging system, which essentially takes charged particles that are transmitted through a specimen (plane) and directs (focuses) them onto analysis apparatus, such as a detector, imaging device, spectroscopic apparatus (such as an EELS device: EELS=Electron Energy-Loss Spectroscopy), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

A known way of studying dynamic specimen behavior in a TEM is to use an electron source comprising a cathode that is "driven" by a pulsed (ultraviolet) laser beam, whereby the cathode emits a shower of electrons when it is impinged upon by a laser pulse. Use of a pulsed electron source in this manner effectively allows a form of stroboscopic imaging, whereby a series of "freezeframe" images can be made in rapid temporal succession. Such a TEM is often referred to a Dynamic TEM (DTEM). However, this approach assumes that the employed detector will be fast enough to separately register the individual images in the pulsed series; unfortunately, for many ultra-short-timescale dynamic processes, conventionally available cameras do not offer sufficient capture speed/frame refresh rate.

An alternative known approach is to use a detector with an area much larger than the image footprint, and to deflect successive images onto different regions of the detector ... creating a "collage" of individual images on the detector prior to readout/refresh. However, such an approach is disadvantageous in that:

It requires a very large detector area and/or can only deal with relatively small images (small magnification);

A relatively large deflection amplitude is required to position each successive image onto a different area of the detector. Whether the employed deflection system is optical or mechanical in nature, a relatively large deflection amplitude will generally require a relatively long settling time thereafter, if image blur is to be avoided. This costs throughput, and can lead to "missed action" in the case of a rapidly changing specimen;

The imaging beam generally has to be shuttered during each image deflection step.

It is an object of the invention to address these issues. More specifically, it is an object of the invention to provide a method/apparatus for TCPM-based time-resolved study of dynamic/evolving specimens that is compatible with relatively slow detectors. In addition, it is an object of the invention that said method/apparatus should not rely on the use of a large detector and/or large-amplitude image/detector deflection.

These and other objects are achieved in a method as set forth in the opening paragraph above, characterized by:

Sparsifying said beam so as to produce at detector level an image comprising a distribution of sub-images that are mutually isolated from one another at least along an elected scan path;

Using a scanning assembly to cause relative motion of said image and said detector along said scan path during a time interval $\Delta t$, so as to smear out each sub-image into a detection streak on said detector, each such streak capturing temporal evolution of its associated sub-image during said time interval $\Delta t$.

The invention uses said sparsification so as to exploit intra-image deflection rather than inter-image deflection—thereby avoiding the need to use a large detector and/or large-amplitude image/detector deflection, since deflection occurs within the (relatively small) footprint of the image itself. To this end, the invention converts a dense array of sub-regions at specimen level—in which neighboring sub-regions are contiguous—into a sparse/rarefied array of sub-images at detector level—in which neighboring sub-images are isolated from one another by intervening gaps, at least along a pre-selected scan trajectory. The mutual isolation of sub-images along said scan trajectory—with a smallest separation $Y_o$—leaves room for a given array cell/unit to be smeared out (displaced/spread) along the scan direction by a distance $Y_o$ (or less), thus creating a time-lapse streak image of the cell/unit in question. It should be noted that:

In basic form, the invention only captures such a time-lapse image for said distribution of sub-images—rather than for a whole/conventional image—but this nevertheless provides useful imaging information in a variety of situations, since:

In many instances, specimens are largely homogeneous, and one can therefore suffice with studying a sampling of sub-regions of the specimen rather than having to monitor the entirety of a specimen (or particular region of a specimen). For example, one may be interested in studying a general specimen property—such as hydration, crystalline structure, etc.—which may be (largely) position-independent;

In instances in which a specimen is non-homogeneous and contains a specific study object embedded in a surrounding mass of material—such as a mineral nugget, particular molecule, biological entity (e.g. a virus, prion or mitochondrion), etc.—one can, if desired, adjust the parameters of the employed sparsification so that a study object of interest falls within one of the sub-images. This will be discussed in more detail below.

In more advanced form, the invention offers possibilities to re-construct a whole image from said distribution of sub-images. This will be discussed in more detail below.

In an embodiment of the invention, said sparsifying comprises using a spatial filter to manipulate a footprint of the charged particle beam by selectively blocking some portions thereof while allowing other portions to pass, the passed portions forming said sub-images. The spatial filter may, for example, comprise a (metallic) plate in which appropriate apertures have been provided, and it may be disposed upstream and/or downstream of the specimen (resulting in sparsification of the impinging beam and/or emergent beam, respectively). If desired, the spatial filter may be held on an exchanger mechanism (such as a carrousel or robot arm) that can exchange it into/out of the beam path, and (optionally) can adjust its position/attitude relative to the beam; such an exchanger mechanism can, for example, cooperate with a storage unit such as a rack, in which a library of different spatial filters can be stored. Specific (non-limiting) examples of aperture patterns include (with reference to a Cartesian coordinate system, for instance):

A plurality of elongate slits (or just a single such slit), each extending along an X direction, and separated from one another along a Y direction. Scanning parallel to Y will smear out each slit into a (relatively wide) detection streak. If neighboring slits have a (smallest) separation $Y_o$, then each streak will have a length $\leq Y_o$.

A skewed distribution of relatively small (square) windows, in which:

In any given row, neighboring windows have a (smallest) separation $Y_o$;

Successive columns (parallel to X) are staggered/displaced relative to one another (in the Y direction).

A (quasi-)random distribution of relatively small (square) windows.

The skilled artisan will be able to choose an aperture pattern/form/distribution that best suits the particulars of a given situation. See FIGS. 2A, 2B, 4 and 5, for example.

In another embodiment of the invention, said sparsifying comprises using a microlens group to:

Sub-divide the beam into a matrix of beamlets corresponding to said tiled array in the specimen plane, each beamlet having an incident width in a plane of the microlens group;

Focus each beamlet to a waist width less than said incident width.

An important advantage of this approach—as opposed to that in the previous paragraph—is that it doesn't discard substantial amounts of beam flux in sparsifying the image, since flux is re-distributed (concentrated) rather than selectively blocked. A relatively straightforward embodiment of such a microlens group comprises a conducting plate in which a matrix arrangement of (circular) holes has been provided; when the plate is electrified, the edge/perimeter of each hole produces an electric field that has a focusing action. The skilled artisan will understand that not all microlenses in the group need necessarily be mutually identical. Somewhat analogous to the embodiment in the previous paragraph, it is possible to dispose a microlens group as here described in at least one of the following locations:
  (a) Between the source and the specimen, to focus said beamlets onto the specimen plane;
  (b) Between the specimen and the detector, to focus said beamlets onto the detector plane.

In scenario (a), only a small zone (corresponding to said waist width) of each specimen sub-region is illuminated; a focusing assembly downstream of the specimen can then be used to ensure that said zone remains relatively shrunk—and isolated from its neighbors—when projected onto the detector plane. In scenario (b), a sub-region at specimen level is shrunk by the microlens group into a much smaller zone (corresponding to said waist width) at detector level; as a result of this shrink, each such zone will be relatively distal from its neighbors. See FIG. 3, for example. The skilled artisan will understand that the "waist" referred to here does not have to correspond to a minimal width (focal plane width) of the beam; instead, some amount of defocus can be present, as is often the case in electron microscopy.

The scanning assembly used to smear out each sub-region can, for example, be selected from the group comprising:
  (i) A beam deflection module (e.g. comprising deflection coils/electrodes) to displace said image upon the detector;
  (ii) An actuator module (e.g. motorized stage) connected to the detector, to displace the detector relative to the image,
and combinations hereof. Beam scanning (technique (i)) is the traditional approach used in scanning-type CPMs (such as SEMs and STEMs), and it can be relatively easily modified to occur after/below rather than before/above the specimen, to facilitate the present invention. Approach (ii) is less common in CPMs, though this does not have to present a technical hurdle, since sophisticated scanning stages are already used in fields such as lithography, and are available in many different implementations. If the planned scan path is substantially linear in form, then the scanning assembly can be relatively basic in its structure, since it nominally only needs to produce deflection parallel to a single direction. However, the scan path does not have to be linear, and could instead have a spiral/coiling/winding form, for example; in such a case (and other, related cases), the employed scanning assembly can be embodied so as to produce compound/composite deflection, along two component directions. The scan path could even be a closed curve, such as a circle, ellipse, oval, etc.—an advantage of such a closed curve being that it can have coincident starting and finishing points, which can be advantageous from the point of view of scanning mechanics (via-à-vis effects such as hysteresis, reversal, jerk, etc., which are pertinent to both motional approaches (i) and (ii) above).

The detection streaks produced by the relative scanning motion of image/detector may be continuous, but can also be discontinuous, if desired; in the latter case, each detection streak comprises a consecutive series of substantially instantaneous snapshots, in substantially abutted arrangement (resembling a "staccato" train of individual sub-images, akin to a stroboscopic photo series). Such an embodiment can, for example, be realized with the aid of an oscillatory shutter, which masks the imaging beam between snapshots. An arrangement such as this can, for example, be advantageous if one wishes to perform mathematical reconstruction upon the detection streaks (see the next paragraph).

A useful way to understand/execute the sparsification employed in the present invention is to:
  Conceptually sub-divide a footprint of the beam incident on the specimen (or the specimen itself) into a tiled array of contiguous sub-regions within the specimen plane;
  Apply a sparsifying transform to said array and project the resulting image onto the detector, each sub-image (see above) corresponding to a particular one of said sub-regions in the specimen plane.

The Embodiments below give some examples of such (mathematical) transforms.

As set forth above, the present invention produces a rarefied distribution of sub-images at detector level, and each of these sub-images is smeared out into a detection streak. If one sub-divides the scan time interval $\Delta t$ into a discrete number of component time quanta, then the invention effectively produces a distribution of sub-images for each of those time quanta. In an embodiment of the invention, the distribution of sub-images corresponding to a given one of said time quanta are used to reconstruct a whole (or, at least, larger) image for that time quantum. Such reconstruction can occur in different ways. For example:
  (I) When using a microlens group as set forth in scenario (b) above, each microlens effectively applies a shrinkage transform to one of the sub-regions/tiles on the specimen. If the inverse of this transform (a re-expansion) is applied to each of the sub-images corresponding to a given time quantum, then—after appropriate "stitching" of the sub-images thus expanded—a whole image can be assembled/recovered/re-constituted.
  (II) When using a spatial filter with a (quasi-)random distribution of apertures, one can apply mathematical reconstruction techniques known from compressive sensing technology.

As alluded to above, the employed sparsification may lead to a situation whereby a given study object of interest in the specimen is unintentionally absent from the distribution of sub-images. This may, for example, happen if:
  Sparsification is performed using a spatial filter, and the study object concerned does not (fully) fall within the footprint of one of the apertures in the filter.
  Sparsification is performed using microlens scenario (a) above, and the study object concerned does not (fully) fall within one of the illuminated zones on the specimen (associated with the beamlet waists).

In such cases, it is possible to effect a corrective adjustment of the relative position/attitude of the detector and the device (spatial filter and/or microlens group) used to produce the desired sparsification—e.g. a (slight) displacement and/or rotation. Alternatively, in the case of a library of spatial filters used in conjunction with an exchanger mechanism, one can swap a first spatial filter for a second one with a different aperture configuration.

The skilled artisan will understand that the (pixelated) detector used in the present invention may, for example, comprise a CCD (Charge-Coupled Device) or CMOS (Complementary Metal Oxide Semiconductor) sensor, for example.

The invention will now be elucidated in more detail on the basis of exemplary embodiments and the accompanying schematic drawings (not to scale), in which.

In the Figures, where pertinent, corresponding parts are indicated using corresponding reference symbols.

EMBODIMENT 1

Figure 1:
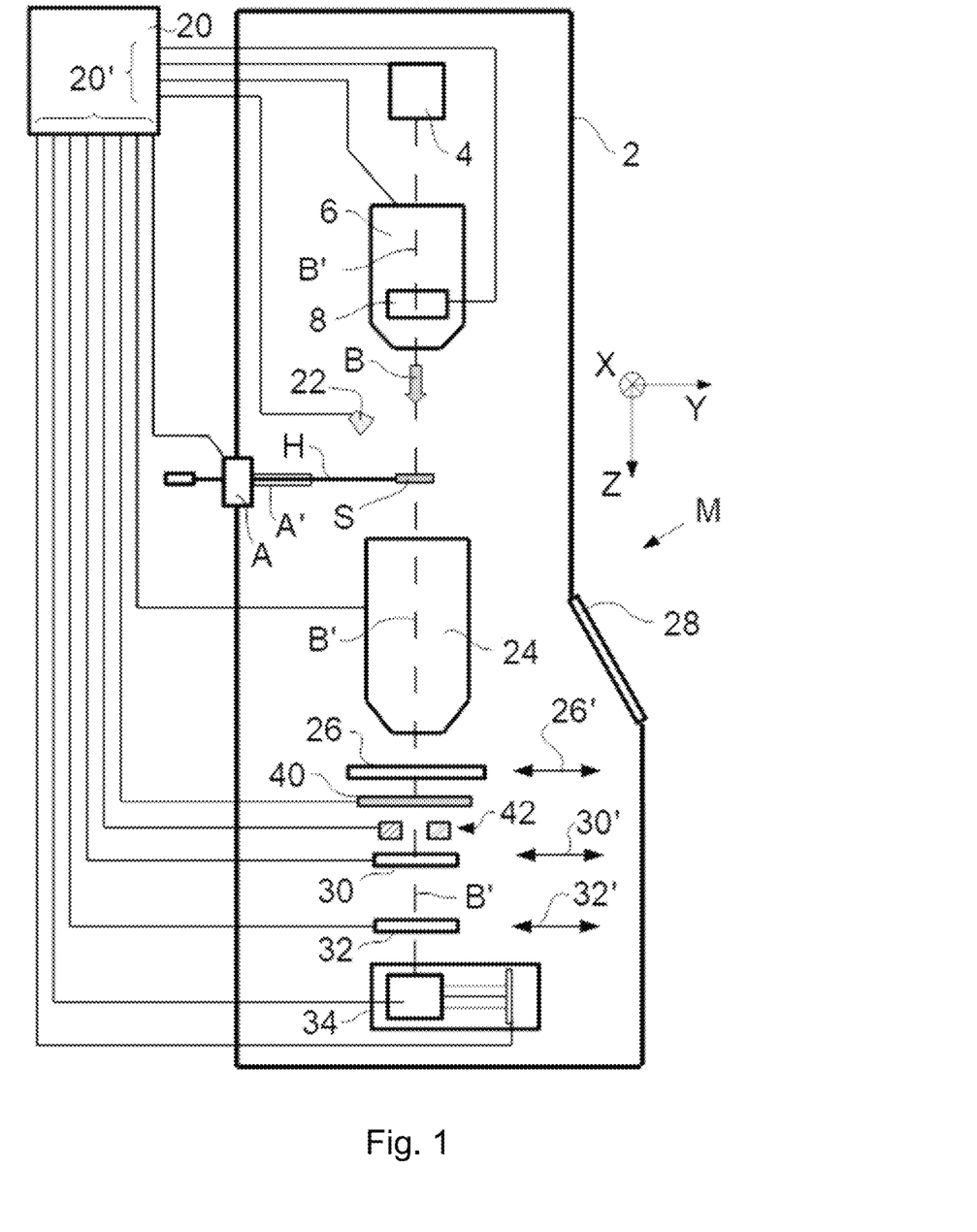
FIG. 1 renders a longitudinal cross-sectional elevation view of an embodiment of a TCPM in which the present invention is implemented.

FIG. 1 (not to scale) is a highly schematic depiction of an embodiment of a TCPM M in which the present invention is implemented; more specifically, it shows an embodiment of a TEM/STEM (though, in the context of the current invention, it could just as validly be a TSEM or an ion-based microscope, for example). In the Figure, within a vacuum enclosure 2, an electron source 4 produces a beam B of electrons that propagates along an electron-optical axis B' and traverses an electron-optical illuminator (charged particle beam column) 6, serving to direct/focus the electrons onto a chosen part of a specimen S (which may, for example, be (locally) thinned/planarized). Also depicted is a deflector 8, which (inter alia) can be used to effect scanning motion of the beam B.

The specimen S is held on a specimen holder H that can be positioned in multiple degrees of freedom by a positioning device/stage A, which moves a cradle A' into which holder H is (removably) affixed; for example, the specimen holder H may comprise a finger that can be moved (inter alia) in the XY plane (see the depicted Cartesian coordinate system; typically, motion parallel to Z and tilt about X/Y will also be possible). Such movement allows different parts of the specimen S to be illuminated/imaged/inspected by the electron beam B traveling along axis B' (in the Z direction), and/or allows scanning motion to be performed as an alternative/supplement to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen S, exit/emanate from it and continue to propagate (substantially, though generally with some deflection/scattering) along axis B'. Such a transmitted electron flux enters an imaging system (projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image or diffractogram of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image/diffractogram on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera (detector) 30, the electron flux can form a static image or diffractogram that can be processed by controller/processor 20 and displayed on a display device (not depicted), such as a flat panel display, for example. When not required, camera 30 can be retracted/withdrawn (as schematically indicated by arrows 30') so as to get it out of the way of axis B'.

STEM camera 32. An output from camera 32 can be recorded as a function of (X,Y) scanning position of the beam B on the specimen S, and an image can be constructed that is a "map" of output from camera 32 as a function of X,Y. Camera 32 can comprise a single pixel with a diameter of e.g. 20 mm, as opposed to the matrix of pixels characteristically present in camera 30. Moreover, camera 32 will generally have a much higher acquisition rate (e.g. $10^6$ points per second) than camera 30 (e.g. $10^2$ images per second). Once again, when not required, camera 32 can be retracted/withdrawn (as schematically indicated by arrows 32') so as to get it out of the way of axis B' (although such retraction would not be a necessity in the case of a donut-shaped annular dark field camera 32, for example; in such a camera, a central hole would allow flux passage when the camera was not in use).

As an alternative to imaging using cameras 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (not depicted). Needless to say, the (schematically depicted) controller 20 may be (partially) inside or outside the enclosure 2, and may have a unitary or composite structure, as desired.

The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis B', taking the form of a small tube (e.g. of the order of 1 cm in diameter) through which the employed electron beam passes, but widening out to accommodate structures such as the source 4, specimen holder H, screen 26, camera 30, camera 32, spectroscopic apparatus 34, etc.

In the context of the present invention, the specimen S can be regarded as being overlaid by a notional/abstract grid (extending parallel to the XY plane) that conceptually sub-divides it into a tiled array of contiguous sub-regions (e.g. units/cells in linear, orthogonal, polar/concentric or hexagonal-packed arrangement). In order to be able to "manipulate" this array so as to perform the present invention, the microscope M comprises a device 40 for applying a sparsifying transform to said array. As discussed above, device 40 may, for example, comprise a (variable/retractable) spatial filter and/or a microlens group, for instance. As here depicted, it is located between the specimen S and detector (TEM camera) 30, but it could alternatively/supplementally be provided upstream of specimen S (e.g. between illuminator 6 and specimen S). The ultimate effect of device 40 is to cause an image formed on detector 30 to comprise a distribution of sub-images that are mutually isolated from one another at least along an elected scan path (e.g. parallel to Y), each sub-image corresponding to (being the transform of) a particular one of said sub-regions in the specimen S.

Also illustrated is a scanning assembly 42, which may, for example, comprise a pair (or two pairs) of deflecting electrodes that straddle the optical axis B', so as to effect lateral displacement of the beam B parallel to the XY plane [see option (i) above]. Alternatively/supplementally, the detector 30 could be connected to a mechanical stage (not shown) that would allow it to be laterally displaced parallel to the XY plane [option (ii) above]. In either case, such relative motion of detector 30 and the electron flux (imaging beam; image) impinging upon it has the effect of smearing out each of said sub-images into a detection streak (detection locus) on detector 30, each such streak capturing temporal evolution of its associated sub-image during said time interval $\Delta t$ (see below).

Figure 2A:
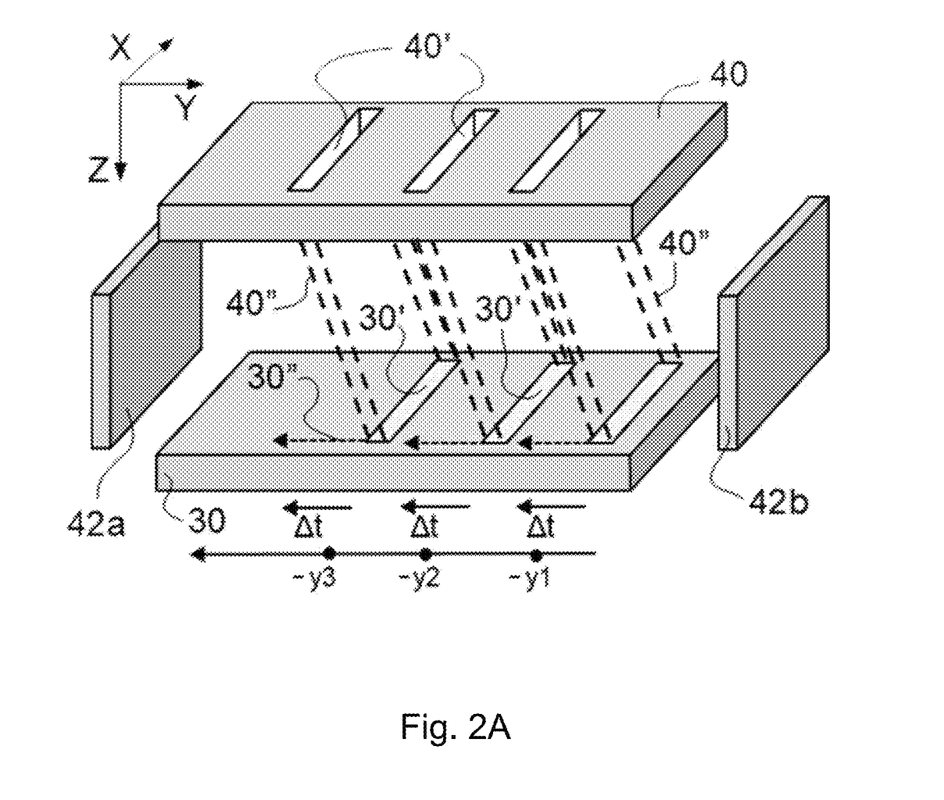
FIG. 2A renders a detailed perspective view of part of the subject of FIG. 1, pertaining to a first embodiment of the invention.
Figure 2B:
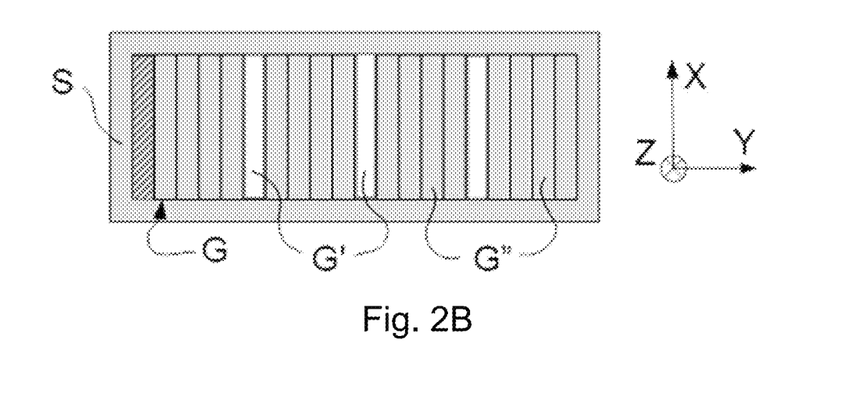
FIG. 2B renders a detailed plan view of the specimen in FIG. 1, and illustrates an aspect that is exploited in FIG. 2A.

Turning now to FIG. 2A, this shows a detailed perspective view of part of the subject of FIG. 1, and illustrates a specific embodiment of the invention in which item 40 is a spatial filter/aperture plate. FIG. 2B corresponds to the same scenario as that shown in FIG. 2A, but renders a plan view of the specimen S. Starting with FIG. 2B, this shows how (the footprint of) the specimen S has been notionally overlaid by a grid G that conceptually sub-divides the specimen S into a tiled array of contiguous sub-regions within the specimen plane (parallel to the XY plane); in this particular case, each sub-region is an elongate rectangle with a long side parallel to X and a short side parallel to Y—though this is only one of many different possible array configurations. In FIG. 2A, the aperture plate 40 comprises three apertures 40', which correspond to the white rectangles G' in FIG. 2B; the effect of aperture plate 40 is thus to sparsify (the image of) the grid G, only admitting electrons through grid positions G'—which are mutually isolated parallel to Y—and blocking electrons that impinge upon grid positions G". Note that open grid positions G' occur at intervals of five grid positions along Y, so that the aperture plate 40 effectively applies the following sparsifying (mathematical) transform to the array defined by grid G:

$$F_1(A_1)=A_2$$

$$A_2(\Delta Y_i)=A_1(\Delta Y_i),$$

if i=5n, where n is an integer
0, for other values of i,
where $A_1, A_2$ are input and output arrays, respectively, and $\Delta Y_i$ is the rectangle at position/ordinal i along the Y axis, taking the hatched rectangle on the left as being at position/ordinal zero.

Returning now to FIG. 2A, deflecting electrodes 42a, 42b can be used to laterally deflect electrons that pass through apertures 40', displacing them parallel to the Y direction. The broken/dashed lines 40" illustrate the paths taken by electrons between the apertures 40' and the corresponding sub-images 30' on the detector 30 (possible scaling/magnification effects neglected, for simplicity), and the left-pointing arrows 30" illustrate how these sub-images 30' can be smeared out along the Y axis during a time interval $\Delta t$ (by suitably invoking deflectors 42a, 42b), the separation of the apertures 40' parallel to Y determining the maximum length of each such smear/deflection streak. As already discussed above, each such smear can be a continuous deflection, or a staccato series of consecutive, discrete, instantaneous snapshots, for example.

EMBODIMENT 2

Figure 3:
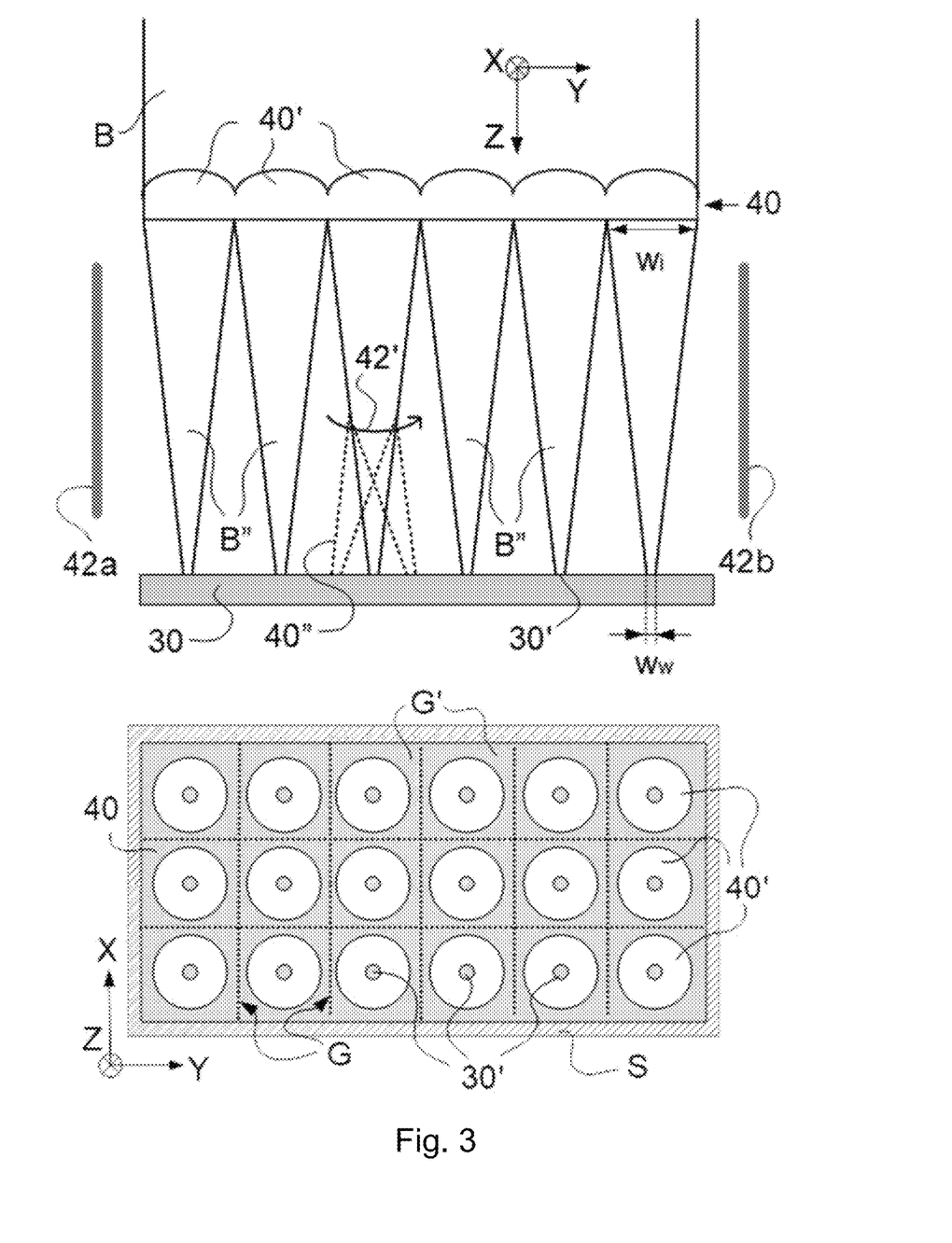
FIG. 3 shows detailed views of parts of FIG. 1, pertaining to a second embodiment of the invention.

FIG. 3 shows detailed views of parts of FIG. 1, pertaining to a second embodiment of the present invention. In this embodiment, item 40 in FIG. 1 is selected to be a microlens group, which is shown in elevation in the upper part of FIG. 3 and in corresponding plan view in the lower part of FIG. 3. Starting with the lower part of the Figure, this shows how (the footprint of) the specimen S has been abstractly overlaid by a grid G that conceptually sub-divides the specimen S into a tiled array of contiguous sub-regions G' within the specimen plane (parallel to the XY plane); in this particular case, each sub-region G' is a square—though there are other possible array configurations. Superimposed hereunder is a plan view of the microlens group 40 (possible scaling/magnification effects neglected, for simplicity), which comprises a matrix arrangement of (circular) openings 40' in a conducting (e.g. metallic) plate to which a suitable electric potential can be applied. When suitably electrified, the microlens group 40 has the effect of:

Sub-dividing the beam B into a matrix of beamlets B" corresponding to the tiled array created by the grid G. Each of these beamlets B" has an incident width $w_i$ in a plane (parallel to the XY plane) of the microlens group 40.

Focusing each beamlet B" onto the detector 30, so as to form a sub-image 30' with a waist width $w_w < w_i$.

Note that the sub-images 30' are mutually isolated parallel to Y (and also parallel to X). The effect of microlens group 40 is thus to sparsify (the image of) the grid G, by:

Only admitting electrons that pass through openings 40';

"Compressing" each beam let B" of admitted electrons from an initial width $w_i$ to a detector-level width $w_w$.

The microlens group 40 thus effectively applies the following sparsifying (mathematical) transform to each cell/unit G' of the array created by grid G:

$$F_2(A_1)=A'_2$$

$$A'_2(\Delta X_i, Y_i)=a^2 \cdot A_1(a \cdot X_i, a \cdot Y_i),$$

for $R_i < w_w/2$,
0, otherwise
where $a=w_i/w_w>1$, and $X_i, Y_i$ are Cartesian coordinates inside the i-th sub-region G' such that $X_i, Y_i=0$ in the center of that sub-region, and $R_i$ is the distance from that center.

Returning to the upper part of FIG. 3, deflecting electrodes 42a, 42b can be used to laterally deflect beamlets B", displacing them at will parallel to the Y direction (in this particular case; displacement parallel to X could be done with another pair of electrodes, and a compound (diagonal) displacement could be achieved using both Y and X electrodes, which might achieve more efficient space filling, for example). The broken/dashed lines 40", and arrow 42', schematically illustrate the potential paths taken by beamlets B" as a result of such deflection, which can be used to smear sub-images 30' out along the Y axis (or other direction) during a time interval Δt. The separation of the sub-images 30' parallel to Y determines the maximum length of each such smear/deflection streak (for deflection parallel to Y). Once again, each such smear can be a continuous deflection, or a staccato series of consecutive, discrete, instantaneous snapshots, for example.

EMBODIMENT 3

Figure 4:
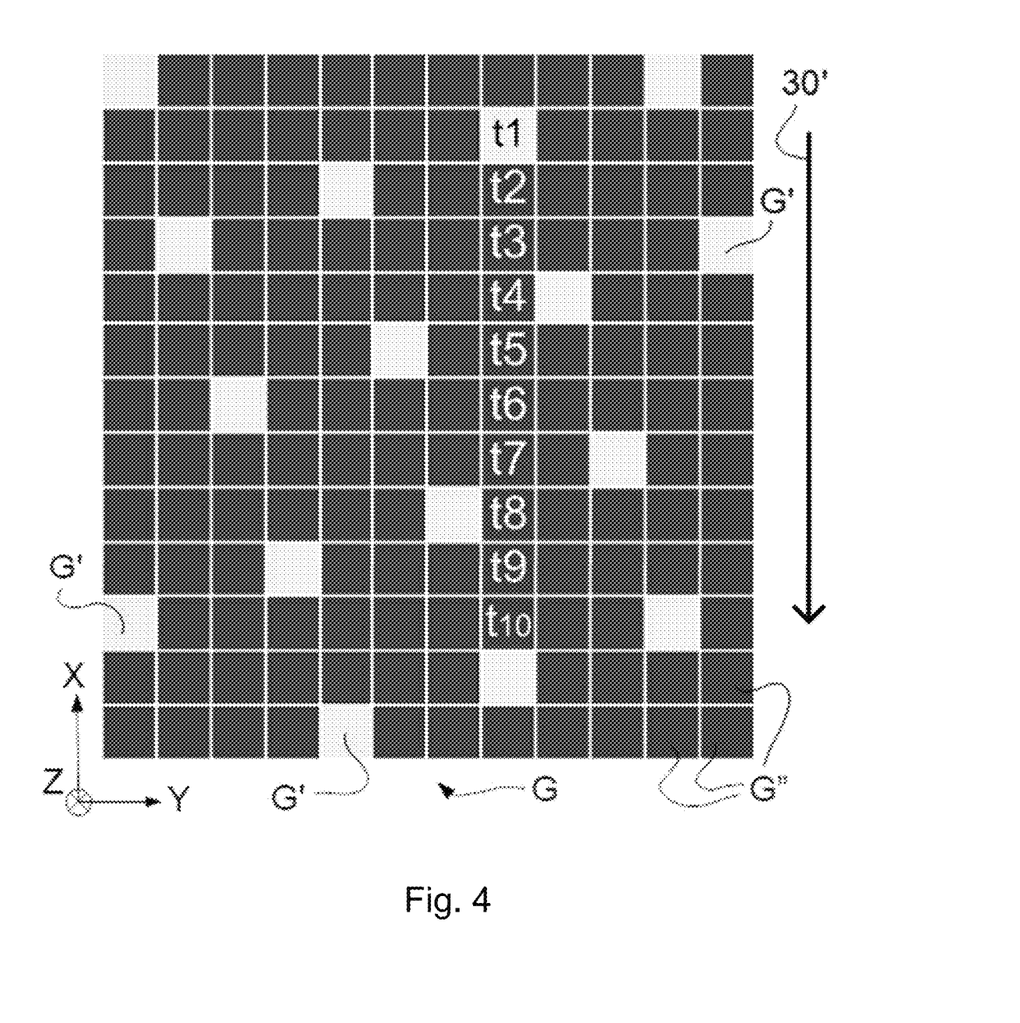
FIG. 4 depicts certain details of yet another embodiment of the invention.

FIG. 4 depicts certain details of yet another embodiment of the invention. More specifically, it shows an alternative grid structure G to that shown in FIG. 2B. Here, the grid G comprises a skewed (sparse) array of bright squares G' in an orthogonal configuration of dark squares G". In a corresponding aperture plate, this effect can be mimicked by allowing the bright squares G' to correspond to apertures in an otherwise closed plate. The long arrow 30' shows a potential scan/deflection along the −X direction, comprising ten time quanta/timestamps t1, t2, . . . , t10.

EMBODIMENT 4

Figure 5:
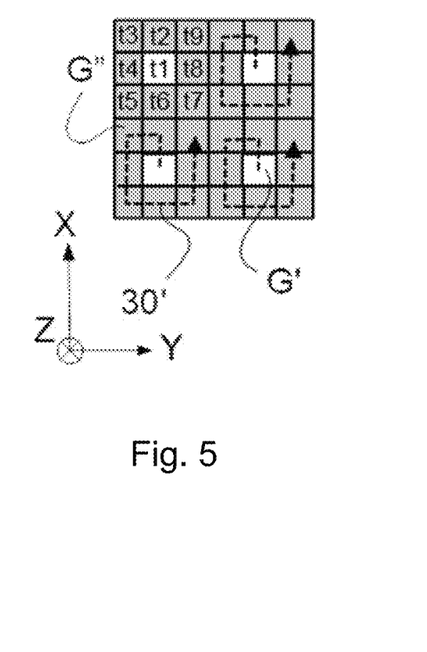
FIG. 5 shows an alternative set-up to the configuration shown in FIG. 4.

FIG. 5 shows an alternative to the situation depicted in FIG. 4, whereby:
  Bright squares G' are now arranged in a regular (non-skewed) square array;
  Scan/deflection path 30' is now spiral in form (e.g. achieved using a coordinated excitation of a pair of deflectors that face each other parallel to X and a similar pair facing each other parallel to Y);
  Time quanta/time stamps t1, t2, . . . , t9 now progress in a wound/coiled arrangement.

The invention claimed is:

1. A method of examining a dynamic specimen using a Transmission Charged Particle Microscope, the method comprising:
  producing, by a source, a beam of charged particles;
  directing, by an illumination system, said beam of charged particles onto a specimen;
  sparsifying said beam of charged particles so as to produce, at a detector, an image comprising a distribution of sub-images that are mutually isolated from one another at least along an elected scan path;
  causing, by a scanning assembly, relative motion of said image and said detector along said scan path during a time interval Δt to smear out each sub-image into a detection streak on said detector, each detection streak capturing temporal evolution of its associated sub-image during said time interval Δt; and
  directing, by an imaging system, charged particles that are transmitted through the specimen onto a detector.

2. The method of claim 1, wherein said sparsifying comprises manipulating a footprint of said beam of charged particles with a spatial filter by selectively blocking some portions thereof while allowing other portions to pass, the passed portions forming said sub-images.

3. The method of claim 2, wherein said spatial filter is disposed in at least one of the following locations:
  between the source and the specimen; and
  between the specimen and the detector.

4. The method of claim 1, wherein said sparsifying comprises sub-dividing the beam into a matrix of beamlets with a microlens group, and focusing each beamlet with the microlens group.

5. The method of claim 4, wherein said microlens group is disposed in at least one of the following locations:
  between the source and the specimen, to focus said beamlets onto the specimen plane; and
  between the specimen and the detector, to focus said beamlets onto the detector plane.

6. The method of claim 1, wherein said scanning assembly is selected from the group comprising:
  a beam deflection module, to displace said image upon the detector;
  an actuator module connected to the detector, to displace the detector relative to the image, and combinations thereof.

7. The method of claim 1, wherein said scan path is substantially linear in form.

8. The method of claim 1, wherein said scan path is substantially spiral in form.

9. The method of claim 1, wherein each detection streak comprises a consecutive series of substantially instantaneous snapshots, in substantially abutted arrangement.

10. The method of claim 1, wherein:
  said time interval Δt is sub-divided into a discrete number of component time quanta; and
  the distribution of sub-images corresponding to a given one of said time quanta are used to reconstruct a whole image for that time quantum.

11. The method of claim 1, wherein:
  said specimen is conceptually sub-divided into a tiled array of contiguous sub-regions within said specimen plane; and
  said sparsification comprises applying a sparsifying transform to said array and projecting the resulting image onto said detector, each said sub-image corresponding to a particular one of said sub-regions in the specimen.

12. A Transmission Charged Particle Microscope comprising:
  a source, for producing a beam of charged particles;
  an illumination system, for directing said beam of charged particle onto a specimen;
  an imaging system, for directing charged particles that are transmitted through the specimen onto a detector;
  a spatial filter arranged to produce at the detector an image of at least portions of the sample comprising a distribution of sub-images that are mutually isolated from one another at least along a scan path;
  a scanning assembly configured to cause relative motion of said image and said detector along said scan path during a time interval Δt so as to smear out each sub-image into a detection streak on said detector, each such streak capturing temporal evolution of its associated sub-image during said time interval Δt; and
  a controller, for controlling at least some operational aspects of the microscope.

13. The microscope of claim 12, wherein the Transmission Charged Particle Microscope is configured to:
  conceptually sub-divide a footprint of said beam on the specimen into a tiled array of contiguous sub-regions within said specimen plane; and apply a sparsifying transform to said array and project the resulting image onto said detector, each said sub-image corresponding to a particular one of said sub-regions in the specimen plane.

14. The microscope of claim 12, wherein the spatial filter is configured to manipulate a footprint of said beam of charged particles by selectively blocking some portions thereof while allowing other portions to pass, the passed portions forming said sub-images.

15. The microscope of claim 12, wherein said spatial filter is disposed in at least one of the following locations:
between the source and the specimen; and
between the specimen and the detector.

16. The microscope of claim 12, wherein the spatial filter is a microlens group formed to sub-divide the beam into a matrix of beamlets, and focus each beamlet.

17. The microscope of claim 16, wherein said microlens group is disposed in at least one of the following locations:
between the source and the specimen, to focus said beamlets onto the specimen plane; and
between the specimen and the detector, to focus said beamlets onto the detector plane.

18. The microscope of claim 12, wherein said scanning assembly is selected from the group comprising:
a beam deflection module, to displace said image upon the detector;
an actuator module connected to the detector, to displace the detector relative to the image, and combinations thereof.

19. The microscope of claim 12, wherein said scan path is substantially linear.

20. The microscope of claim 12, wherein said scan path is substantially spiral.

* * * * *